(12) United States Patent
Schumacher

(10) Patent No.: US 12,715,260 B2
(45) Date of Patent: Aug. 25, 2026

(54) APPARATUS COMPRISING A BATTERY

(71) Applicant: THERMO KING LLC, Minneapolis, MN (US)

(72) Inventor: Ryan Wayne Schumacher, Bloomington, MN (US)

(73) Assignee: THERMO KING LLC, Minneapolis, MN (US)

( * ) Notice: Subject to any disclaimer, the term of this patent is extended or adjusted under 35 U.S.C. 154(b) by 90 days.

(21) Appl. No.: 18/592,802

(22) Filed: Mar. 1, 2024

(65) Prior Publication Data

US 2024/0294049 A1 Sep. 5, 2024

(30) Foreign Application Priority Data

Mar. 2, 2023 (EP) .................................... 23159762

(51) Int. Cl.

| | |
|---|---|
| ***B60H 1/00*** | (2006.01) |
| ***G01R 31/40*** | (2020.01) |
| ***H02J 3/007*** | (2026.01) |
| ***H02J 3/36*** | (2026.01) |
| ***H02J 7/00*** | (2026.01) |

(52) U.S. Cl.

CPC ....... *B60H 1/00264* (2013.01); *B60H 1/0073* (2019.05); *G01R 31/40* (2013.01); *H02J 3/007* (2020.01); *H02J 3/36* (2013.01); *H02J 7/855* (2026.01)

(58) Field of Classification Search

CPC .......................... B60H 1/00264; B60H 1/0073

See application file for complete search history.

(56) References Cited

U.S. PATENT DOCUMENTS

| | | | | |
|---|---|---|---|---|
| 11,183,843 | B1 * | 11/2021 | Cooper | H02J 3/0075 |
| 2008/0164850 | A1 * | 7/2008 | Ayana | H02J 9/00 322/1 |
| 2018/0065446 | A1 | 3/2018 | Hansson et al. | |
| 2021/0138874 | A1 * | 5/2021 | Srnec | B60H 1/3208 |

FOREIGN PATENT DOCUMENTS

| | | |
|---|---|---|
| EP | 3819141 | 5/2021 |

OTHER PUBLICATIONS

Extended European Search Report, issued in the corresponding European patent application No. 23159762.6, dated Aug. 16, 2023, 7 pages.

* cited by examiner

*Primary Examiner* — Elizabeth J Martin
(74) *Attorney, Agent, or Firm* — HSML P.C.

(57) ABSTRACT

The present disclosure relates to an apparatus comprising a controller, a load, a battery, and a DC link. The DC link is coupled to the load, couplable to the battery, and couplable to an external power source. The load comprises an electrical component. The controller is configured to: evaluate a component startup criterion relating to whether the electrical component is performing a startup process, evaluate a source capability criterion relating to a capability of the external power source to supply power to the DC link, and in response to a determination, that the component startup criterion has been met and the source capability criterion has not been met, operate the apparatus in a protected startup mode in which the battery provides power to the DC link.

17 Claims, 7 Drawing Sheets

APPARATUS COMPRISING A BATTERY

FIELD

The present disclosure relates to an apparatus comprising a controller, a load, a battery and a DC link. The controller is configured to operate the apparatus in a protected startup mode in which the battery provides power to the DC link in response to a determination that a component startup criterion has been met and a source capability criterion has not been met. The present disclosure also relates to a transport refrigeration system comprising such an apparatus.

BACKGROUND

It is known for a transport refrigeration unit (TRU) to comprise at least one mechanical device, such as a compressor, which is configured to be driven by an electrical component, such as a motor, which requires a supply of electrical power for operation (that is, to drive the mechanical device of the TRU). The compressor may form a part of a vapour-compression refrigeration circuit of the TRU.

A TRU may generally be configured to perform a startup routine which requires the electrical component to perform a startup process so as to begin driving the mechanical device. For example, the TRU may commence the startup routine in response to a demand to provide heating or cooling to a climate-controlled space of a transport refrigeration system comprising the TRU.

SUMMARY

The embodiments described herein provide an improved apparatus for supplying electrical power to an electrical component during a startup process of the electrical component. In particular, the embodiments described herein provide an apparatus which is configured to supply electrical power to an electrical component for performing a startup process such that the electrical component is able to reliably complete the startup process across a range of operational scenarios for the apparatus.

According to a first aspect, there is provided an apparatus comprising a controller, a load, a battery, and a DC link, wherein: the DC link is coupled to the load, couplable to the battery, and couplable to an external power source; the load comprises an electrical component; and the controller is configured to: evaluate a component startup criterion relating to whether the electrical component is performing a startup process, evaluate a source capability criterion relating to a capability of the external power source to supply power to the DC link, and in response to a determination that the component startup criterion has been met and the source capability criterion has not been met, operate the apparatus in a protected startup mode in which the battery provides power to the DC link.

The controller may be configured to: in response to a determination that the component startup criterion and the source capability criterion have each been met, operate the apparatus in an unprotected startup mode in which the external power source provides power to the DC link and the battery does not provide power to the DC link.

The controller may be configured to: receive source information relating to the external power source; determine whether the source capability criterion has been met based on the source information; and determine that the source capability criterion has not been met in the absence of source information.

It may be that the source information includes a maximum current rating of the external power source. The controller may be configured to: compare the maximum current rating of the external power source to a component startup current value indicative of a maximum current drawn by the load from the DC link during the startup process of the electrical component, determine that the source capability criterion has not been met if the component startup current value exceeds the maximum current rating of the external power source, and determine that the source capability criterion has been met if the component startup current value does not exceed the maximum current rating of the external power source.

The component startup current value may be predictively determined based on a parameter of the electrical component.

It may be that the electrical component is a motor. The parameter of the electrical component may be selected from a group consisting of: a transient current rating of the motor, a calendar age of the motor, a recorded running time of the motor, and a duration since a maintenance activity was performed on the motor.

The electrical component may be configured to drive a mechanical device. The component startup current value may be predictively determined based on a parameter of the mechanical device.

It may be that the mechanical device is a compressor. It may also be that the parameter of the mechanical device is selected from a group consisting of: a design rating of the compressor, a calendar age of the compressor, a recorded running time of the compressor, and a duration since a maintenance activity was performed on the compressor.

The apparatus may further comprise a power converter. The DC link may be couplable to the external power source via the power converter. When operating the apparatus in the protected startup mode, the controller may be operable to: control the power converter to maintain a current supplied to the DC link from the external power source below the maximum current rating of the external power source. Additionally or alternatively, when operating the apparatus in the protected startup mode, the controller may be operable to: control the power converter to maintain a current supplied to the DC link from the external power source within a target range. In addition or instead, when operating the apparatus in the protected startup mode, the controller may be operable to: prevent the external power source from providing power to the DC link.

The controller may be configured to: monitor a current drawn from the DC link by the load; compare the monitored current drawn to a startup drawn current threshold; and determine that the component startup criterion has been met if the monitored current drawn exceeds the startup drawn current threshold.

The controller may be configured to: monitor a current drawn from the DC link by the load; calculate a rate of change of the monitored current drawn; compare the calculated rate of change of the monitored current drawn to a startup drawn current rate of change threshold; and determine that the component startup criterion has been met if the calculated rate of change of the monitored current drawn exceeds the startup drawn current rate of change threshold.

Further, the controller may be configured to: receive a startup signal; and determine whether the component startup criterion has been met based on the startup signal.

According to a second aspect there is provided a transport refrigeration system comprising an apparatus in accordance with the first aspect, wherein the electrical component is configured to drive a compressor of the transport refrigeration system.

DETAILED DESCRIPTION

Figure 1:
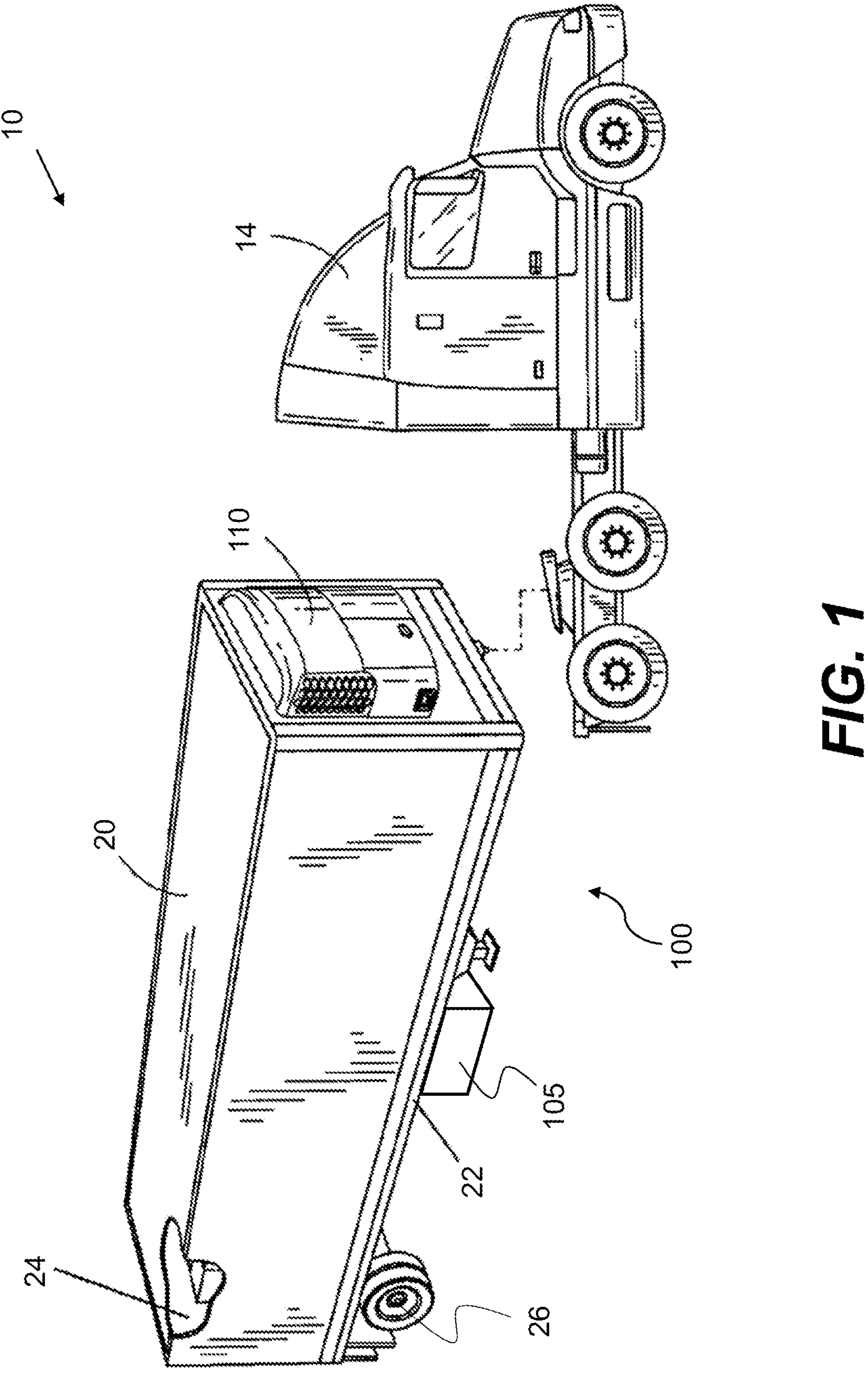
FIG. 1 shows a vehicle comprising a transport refrigeration system.

FIG. 1 shows a vehicle 10 comprising a transport refrigeration system 20. In the example of FIG. 1, the transport refrigeration system 20 forms a part of an over-the-road refrigerated semi-trailer having a structure 22 supporting (or forming) a at least one climate-controlled compartment 24 which is configured to be cooled and/or heated by a TRU 110. The structure 22 includes a chassis. The vehicle 10 comprises an apparatus 100 which includes various components disposed within an under-chassis box 105. In some examples, one or more components of the apparatus 100 may be integrated or incorporated into the TRU 110. The structure 22 supports the TRU 110 and the under-chassis box 105. The vehicle 10 further comprises a tractor unit 14 removably couplable to the trailer. The vehicle 10 comprises at least an axle 26, to which an electrical generator as described below with reference to FIG. 2 may be mechanically coupled. Although the axle 26 is shown as being provided as part of the over-the-road refrigerated semi-trailer in the example of FIG. 1, this need not be the case. For instance, it may be that the axle 26 is provided as part of the tractor unit 14.

Figure 2:
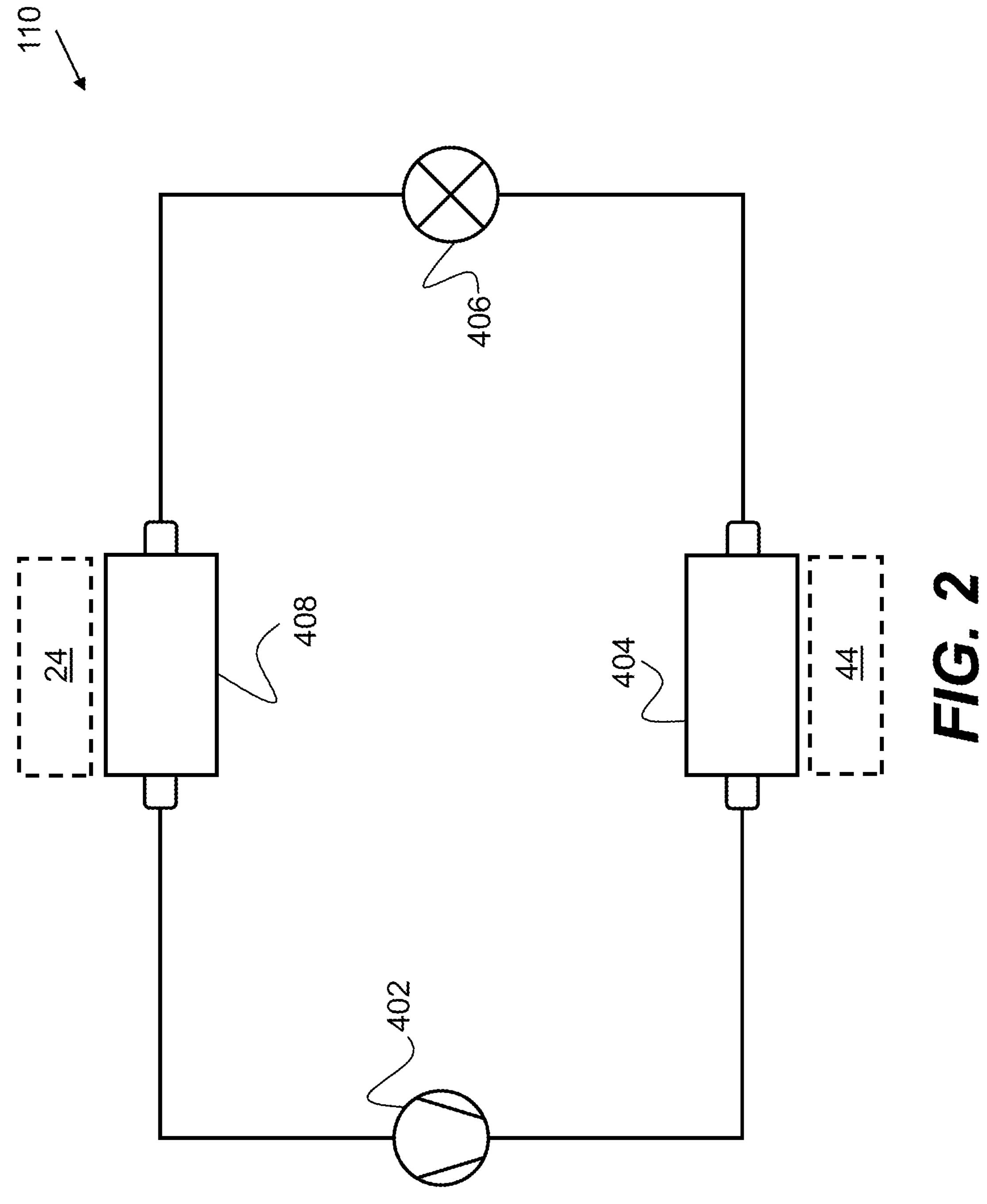
FIG. 2 is a diagram which schematically shows a transport refrigeration unit suitable for use with the transport refrigeration system of FIG. 1.

FIG. 2 schematically shows a diagram of an example TRU 110 suitable for use within the vehicle 10 and the transport refrigeration system 20 of FIG. 1. The TRU 110 comprises a vapour-compression refrigeration circuit 400. The vapour-compression refrigeration circuit 400 includes an evaporator 408 which is configured to receive heat from the climate-controlled compartment 24 of the transport refrigeration system 20 and a condenser 404 which is configured to reject heat to a thermal sink 44 (e.g., ambient air outside of the climate-controlled compartment 24). For these purposes, the vapour-compression refrigeration circuit 400 also includes a compressor 402 and an expansion valve 406. Accordingly, the vapour-compression refrigeration circuit 400 may be controlled to cause heat to be removed from the climate-controlled compartment 24. The vapour-compression refrigeration circuit 400 may be controlled by any number of suitable control methods, as will be apparent to those skilled in the art.

Figure 3:
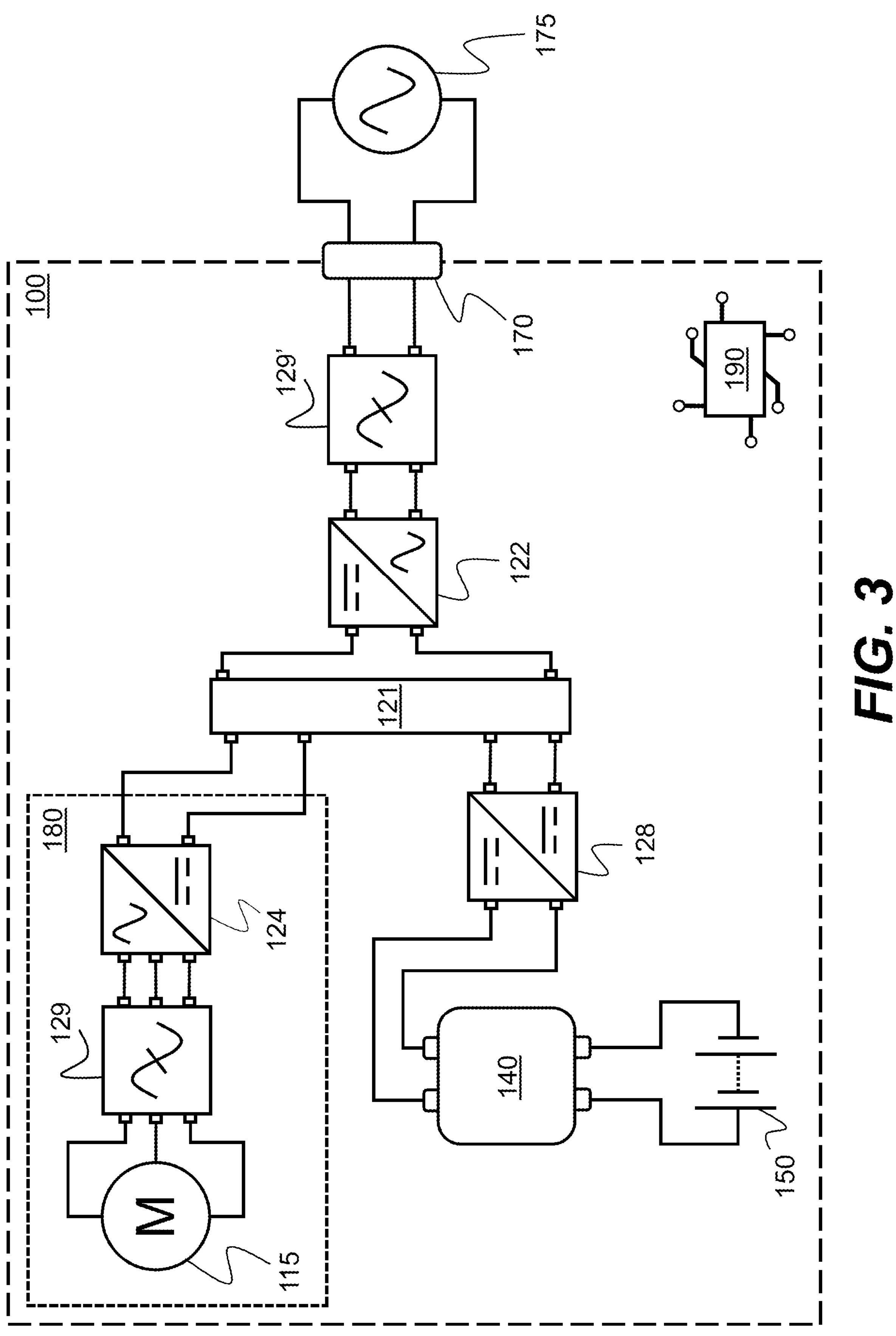
FIG. 3 is a diagram which shows an example apparatus suitable for use with the transport refrigeration system of FIG. 1.

FIG. 3 shows a diagram of an example apparatus 100 suitable for use with a transport refrigeration system 20 comprising a transport refrigeration unit (TRU) 110. The apparatus 100 may be incorporated within a mobile climate-controlled module including a climate-controlled compartment, such as the transport refrigeration system 20 and the climate-controlled compartment 24 shown in FIG. 1. Accordingly, the apparatus 100 is generally configured for use in transit.

The apparatus 100 comprises a DC link 121, a rectifier 122, and a load 180 comprising an electrical component 115. The load 180 may generally be considered to comprise any suitable combination of a resistive load, an inductive load and/or a capacitive load. In the example of FIG. 2, the load 180 comprises an inverter 124 and an AC electrical component 115. However, this disclosure envisages that the load 180 may not comprise an inverter, in which case the electrical component 115 may be a DC electrical component 115. The apparatus 100 further comprises a controller 190. The controller 190 is generally configured to operate the apparatus 100 in accordance with the method described below with reference to FIG. 4.

The electrical component 115 is configured to drive a mechanical device. By way of example, the mechanical device may be a fan, a pump or a compressor of the transport refrigeration system 20. In particular, the electrical component 115 may be a motor 115 which is configured to drive the compressor 402 of the vapour-compression refrigeration circuit 400 of the TRU 110. More particularly, the motor 115 may be an AC asynchronous motor 115 (which may also be referred to as an induction motor 115). In the example of FIG. 2, the motor 115 is a three-phase AC motor 115.

An output of the rectifier 122 is electrically coupled to the DC link 121 and an input of the inverter 124 is also electrically coupled to the DC link 121. Thus, the DC link 121 is coupled to the load 180. An input of the rectifier 122 is electrically couplable to an AC power source external 175 to the apparatus 100 at an external connection port 170 of the apparatus 100. Thus, the DC link 121 is coupled to the load 180 as well as being couplable to the AC external power source 175 at the external connection port 170 via the rectifier 122.

The external power source 175 is external to the apparatus 100 in the sense that any electrical energy storage capacity or electrical energy generation capacity of the external power source 175 is not disposed within the apparatus 100. Generally, the external AC power source 175 may be connected at the connection port 170 when the apparatus 100 is stationary (that is, not in transit), whereas the external AC power source 175 is not connected at the connection port 170 when the apparatus 100 is in transit (that is, not stationary). The external AC power source 175 may be, as a particular example, an electrical grid such as a public or a private electrical grid. The external power source 175 may otherwise be, as a further particular example, a mobile external electrical system such as an electrical system of the tractor unit 14 which is accessible through a power take-off. In addition, the external power source 175 may be, as additional particular examples, a solar bank (e.g. a photovoltaic array) or an engine-driven electrical generator (e.g. a prime mover genset). The external AC power source 175 has an associated power capability.

An output of the inverter 124 is electrically couplable to the AC motor 115 of the load 180. The rectifier 122 and/or the inverter 124 may comprise one or more power switching components. Each power switching component may include, for example, an insulated gate bipolar transistor (IGBT), a junction-gate field-effect transistor (JFET), a thyristor, and/or a metal-oxide-semiconductor field-effect transistor (MOSFET). In particular, each power switching component may include a gate turn-off thyristor (GTO) and/or an integrated gate-commutated thyristor (IGCT).

In use, the rectifier 122 receives an AC input power supplied to its input (e.g., from the external AC power source 175) and converts it into a DC output power which is then supplied to the DC link 121 via the output of the rectifier 122. Conversely, the inverter 124 receives a DC input power supplied to its input by the DC link 121 and converts it into an AC output power, suitable for supplying the AC electrical component 115. Specifically, the inverter 124 is configured to provide an AC output voltage and an AC output current to the AC electrical component 115. The AC output voltage is defined by (e.g., has) a periodic frequency, which may be referred to as the AC output frequency of the inverter 124.

The apparatus 100 may comprise a power distribution unit (PDU) 140 electrically coupled to the DC link 121. If present, the PDU 140 is generally configured to act as an interface between the DC link 121 and a variety of other electrical components of the apparatus 100 which may be electrically coupled to the PDU 140 (e.g., a battery, as discussed below). The PDU 140 may comprise at least one thermal fuse, such that the PDU is able to rapidly decouple the DC link 121 from any components of the apparatus 100 which are electrically coupled to the PDU 140 if a fault current develops within the apparatus 100.

The PDU 140 has a nominal or rated operating voltage. Therefore, any DC electrical voltages which are supplied to the PDU 140 from any electrical components of the apparatus 100 which are electrically coupled to the PDU 140 (including the DC link 121) should match the operating voltage of the PDU. Likewise, any DC electrical voltages which are provided to the PDU 140 from any electrical components of the apparatus 100 which are electrically coupled to the PDU 140 (including the DC link 121) should match the operating voltage of the PDU. The operating voltage of the PDU 140 may be determined according to a voltage of an electrical component of the apparatus 100 which is electrically coupled to the PDU 140.

Further, the apparatus 100 includes a battery 150 which is electrically coupled to the PDU 140. Hence the DC link 121 is couplable to the battery 150 via the PDU 140. Accordingly, the PDU 140 is able to isolate the DC link 121 from the battery 150 to protect the battery 150 from electrical faults originating in another part of the apparatus 100 and vice versa. In such examples, the operating voltage of the PDU 140 corresponds to a voltage of the battery 150. The battery 150 may have a nominal voltage or a rated voltage, which varies according to a state-of-charge (SOC) of the battery 150. If the operating voltage of the PDU 140 is within an acceptable range of the voltage of the battery 150, the battery 150 may be charged (from the DC link 121) and/or discharged (into the DC link 121) via the PDU 140. In use, the battery 150 may function as either an internal DC power source or an internal DC power sink, depending on whether it is being discharged or charged, respectively. The battery 150 is internal to the apparatus 100 (i.e., is an internal power source or an internal power sink) in the sense that the electrical energy storage capacity of the battery 150 is disposed within the apparatus 100.

Additionally, the apparatus 100 may comprise a DC-DC converter 128 coupled between the DC link 121 and the PDU 140 and operative to convert a DC voltage at a second magnitude supplied to the DC-DC converter 128 by the PDU 140 to a DC voltage at a first magnitude for supply to the DC link 121, and to convert a DC voltage at the first magnitude supplied to the DC-DC converter 128 by the DC link 121 to a DC voltage at the second magnitude for supply to the PDU 140. If so, the DC link 121 is coupled to or couplable to the battery 150 via the PDU 140 and the DC-DC converter 128. The DC-DC converter 128 may include a low-pass filter for removing high-frequency variations (e.g., high frequency components arising due to switching of the DC-DC converter) in the electrical power supplied by the DC-DC converter 128. The DC-DC converter 128 may comprise at least one galvanic isolation device, such that the DC-DC converter 128 is able to selectively isolate the PDU 140 from the DC link 121, for example in response to the development of a fault current between the PDU 140 and the DC link 121 for improved safety of the apparatus 100. The DC-DC converter 128 allows the operating voltages of the DC link 121 and the PDU 140, respectively, to be dissimilar. Specifically, the inclusion of the DC-DC converter 128 allows the operating voltage of the DC link 121 to be significantly greater than the operating voltage of the PDU 140 and also allows the operating voltage of the PDU 140 to freely vary as the voltage of the battery 150 varies without having any adverse effects on effective operation of the apparatus 100.

Depending on whether the battery 150 is being charged or discharged, the DC-DC converter 128 performs different functions. When the battery 150 is being charged, the DC-DC converter 128 converts the voltage supplied from the DC link 121 at the operating voltage of the DC link 121 (that is, a voltage having the first voltage magnitude) to a voltage for supply to the PDU 140 at the operating voltage of the PDU 140 (that is, a voltage having the second voltage magnitude, the first voltage magnitude being greater than the second voltage magnitude). Otherwise, when the battery 150 is being discharged, the DC-DC converter 128 converts the voltage supplied from the PDU 140 at the operating voltage of the PDU 140 (that is, a voltage having the second voltage magnitude) to a voltage for supply to the DC link 121 at the operating voltage of the DC link 121 (that is, a voltage having the first voltage magnitude). Accordingly, the DC-DC converter 128 may be considered to be a buck-boost DC-DC converter. The DC-DC converter 128 may comprise a variety of electrical components required in order to function as a buck-boost DC-DC converter, as will be apparent to those skilled in the art.

The first voltage magnitude is the magnitude of the operating voltage of the DC link 121. In order to ensure that the inverter 124 is able easily to provide an AC power output which meets the required voltage for the AC electrical power to be provided to the load 180 across a broad range of operating conditions, the operating voltage of the DC link 121 (and therefore the first voltage magnitude) may be selected so as to be in a range between 600 VDC and 800 VDC. Preferably, the operating voltage of the DC link 121 may be approximately 700 VDC. The second voltage magnitude is the magnitude of the operating voltage of the PDU 140, which in turn corresponds to the output/terminal voltage of the battery 150. Depending on the SOC of the battery 150, the second voltage magnitude may typically vary within a range between 300 VDC and 450 VDC.

As shown in the example apparatus 100 of FIG. 2, the output of the inverter 124 may be electrically couplable to the AC electrical component 115 via an output sine-wave filter 129. The output sine-wave filter 129 is generally configured to increase a degree to which a time-domain profile of an AC electrical power supplied to the AC electrical component 115 in use conforms to a substantially sinusoidal profile. To this end, it may be that the output sine-wave filter 129 comprises a low-pass filter configured to attenuate high frequency components (i.e., components above an upper threshold frequency) of the AC electrical power that is supplied to the AC electrical component 115 in use, such that the time-domain profile of the AC electrical power supplied to the AC electrical component 115 is primarily composed of frequency components below the upper-frequency threshold, which in turn results in an increase in the degree to which the time-domain profile of an AC electrical power supplied to the AC electrical component 115 conforms to a substantially sinusoidal profile. In addition to the low-pass filter, the output sine-wave filter 129 may comprise a high-pass filter configured to attenuate any low frequency components (i.e., components below a lower frequency threshold) of the AC electrical power that is supplied to the AC electrical component 115 in use, such that the time-domain profile of the AC electrical power supplied to the AC electrical component 115 is primarily composed of frequency components between the lower-frequency threshold and the upper-frequency threshold. This may further increase the degree to which the time-domain profile of an AC electrical power supplied to the AC electrical component 115 conforms to a substantially sinusoidal profile. As will be appreciated by those of ordinary skill in the art, equivalent functionality can be achieved through the use of a band pass filter, configured with a suitable pass band, as the output sine-wave filter 129.

It may be that for optimal operation, the AC electrical component 115 should receive a supply of an AC electrical power supply having a substantially sinusoidal time-domain profile is beneficial. However, it may be that a time-domain profile of an AC electrical power provided by the output of the inverter 124 is substantially non-sinusoidal. For instance, the time-domain profile of the AC electrical power provided by the output of the inverter 124 may substantially conform to a rectangular or square wave, or another non-sinusoidal wave. Electrical coupling of the output of the inverter 124 to the AC electrical component 115 via the output sine-wave filter 129 increases the conformity of the time-domain profile of the AC electrical power provided to the AC electrical component 115 to a substantially sinusoidal profile, and therefore enables more effective operation of the AC electrical component 115.

As also shown in the example apparatus 100 of FIG. 2, the input of the rectifier 122 may be electrically couplable to the external AC power source 175 at the connection port 170 via an input filter 129'. The input filter 129' is generally configured to remove noise from an AC electrical power supplied to the rectifier 122. For this purpose, the input filter 129' may comprise at least one low-pass filter as described above with respect to the output sine-wave filter 129. It may be that the operation of rectifier 122 is improved when the supply of AC electrical power does not contain a significant amount of noise. The input filter 129' may therefore enable more effective operation of the rectifier 122.

It will be appreciated that in other examples, the output of the inverter 124 is not electrically couplable to the AC electrical component 115 via the output sine-wave filter 129 and/or the input of the rectifier 122 is not electrically couplable to the external AC power source via the input filter 129'.

Moreover, although it has been described that the apparatus 100 is configured to receive an AC electrical power from an AC external power source 175 with respect to the example of FIG. 3, this need not necessarily be the case. For example, it may be that the apparatus 100 is configured to receive a DC electrical power from a DC external power source 175 (e.g. if the external power source 175 is a solar bank). If so, the rectifier 122 may be replaced with an additional DC-DC converter to provide a suitable interface between the external power source 175 and the DC link 121. The alternatives of the rectifier 122 and the additional DC-DC converter both provide power conversion functionality between the DC link 121 and the external power source 175. Therefore, either the rectifier 122 or the additional DC-DC converter may be referred to as a power converter 122. References herein to the power converter 122 should be understood as referring to either the rectifier 122 (in the case of the apparatus 100 being configured to receive an AC electrical power from an AC external power source 175) or the additional DC-DC converter (in the case of the apparatus 100 being configured to receive a DC electrical power from a DC external power source 175) as applicable and appropriate.

Further, while it has been described that the apparatus 100 may comprise a PDU 140 electrically coupled to the DC link 121, this need not necessarily be the case. For instance, it may be that the battery 150 is electrically coupled to the DC link 121 (e.g., via the DC-DC converter 128 but not via the PDU 140 or directly to the DC link 121). In addition or instead, it may be that the input of the rectifier 122 is not electrically couplable to (or coupled to) the external power source external 175 at an external connection port 170.

Figure 4:
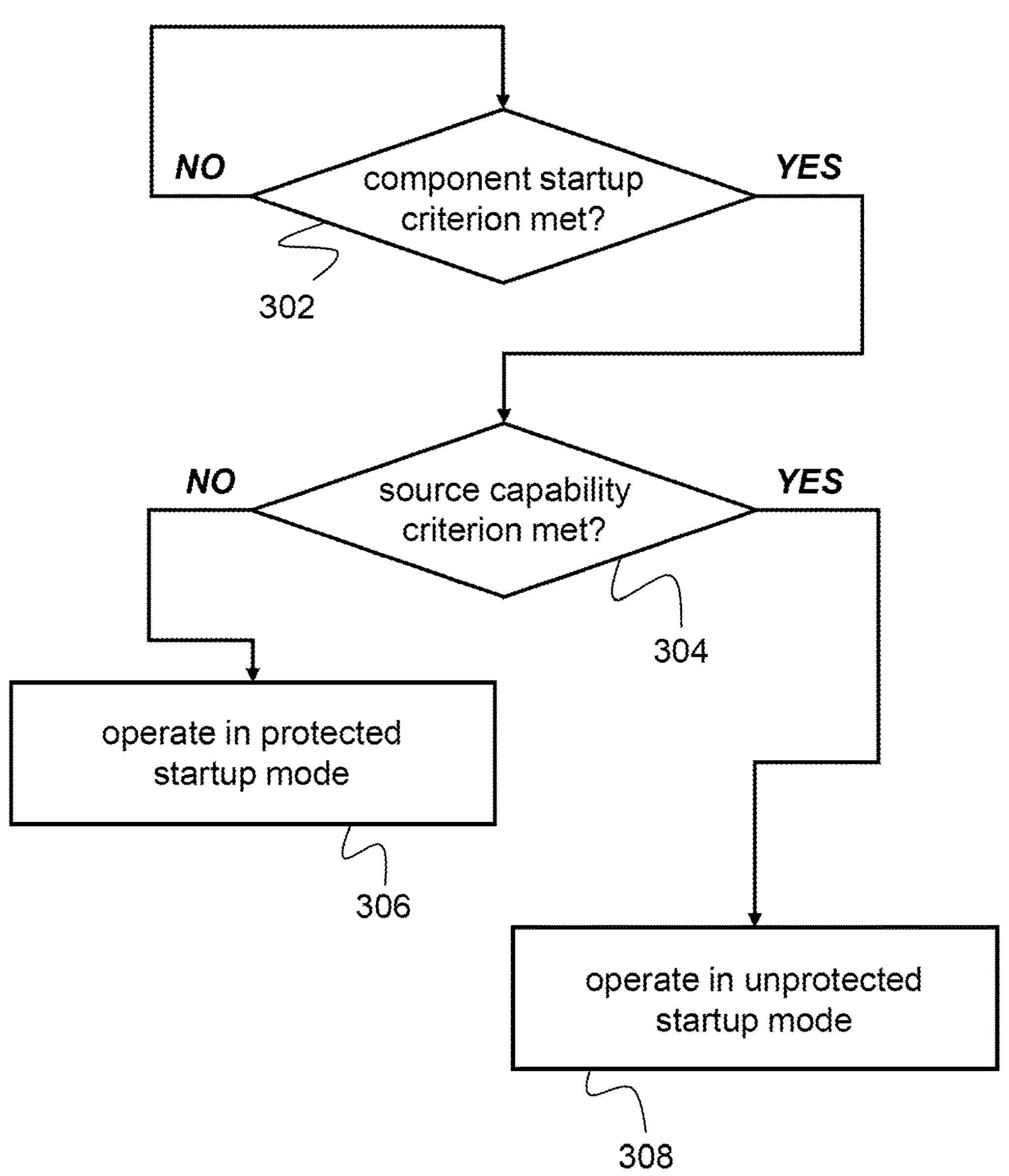
FIG. 4 is a flowchart which shows an example method of operating the example apparatus of FIG. 3.

FIG. 4 is a flowchart which shows an example method 300 of operating the apparatus 100. As discussed above, the method 300 is generally implemented by the controller 190. The method 300 comprises a process of evaluating (at block 302) a component startup criterion. In response to a determination (in block 302) that the component startup criterion has not been met, the method 300 returns to the process of evaluating (at block 302) the component startup criterion such that the component startup criterion is repeatedly re-evaluated until a determination (in block 302) is made that the component startup criterion has been met. In response to a determination (in block 302) that the component startup criterion has been met, the method 300 continues to a process of evaluating (at block 304) a source capability criterion. In turn, in response to a determination (in block 304) that the source capability criterion has not been met, the method 300 continues to a process of operating (at block 306) the apparatus 100 in a protected startup mode. Otherwise, in response to a determination (in block 304) that the source capability criterion has been met, the method 300 continues to a process of operating (at block 308) the apparatus 100 in an unprotected startup mode. Each of the processes represented by blocks 302, 304, 306 and 308 are described in further detail below with reference to FIGS. 5, 6, 7 and 8, respectively.

Figure 5:
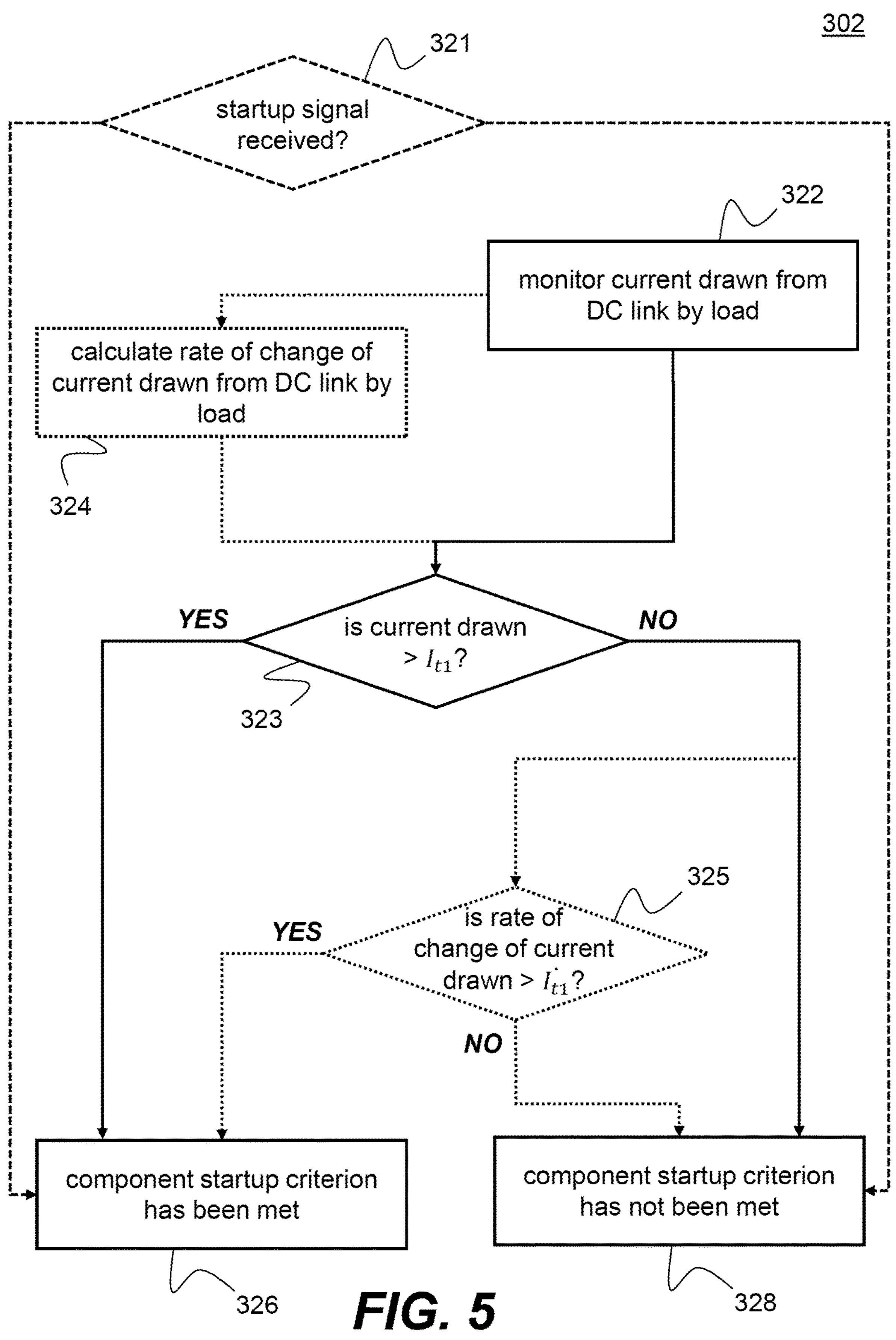
FIG. 5 is a flowchart which shows an example implementation of a process of evaluating a component startup criterion, as part of the method shown in FIG. 4.

FIG. 5 is a flowchart which shows an example implementation of the process of evaluating the component startup criterion, as represented by block 302 in FIG. 4. In general, the component startup criterion relates to whether the electrical component 115 is performing (e.g., undergoing) a startup process.

The controller 190 may be configured to receive a startup signal and to determine whether the component startup criterion has been met based on the startup signal. By way of example, the startup signal may be a signal received from a controller of the TRU 110 indicating that the TRU 110 is about to execute a startup routine which requires the electrical component 115 to perform the startup process and begin driving the mechanical device. For instance, the TRU 110 may commence the startup routine in response to a demand to provide cooling or heating to the climate-controlled compartment 24 of the transport refrigeration system 20. By way of further example, the startup signal may be a signal received from a controller of the electrical component 115 or the mechanical device (e.g., the compressor 402) which the electrical component 115 is configured to drive indicating that the electrical component 115 is required to perform the startup process.

Accordingly, the process of evaluating the component startup criterion may comprise an action of determining (at block 321) whether the startup signal has been received. If the startup signal has been received, the process continues to an action of determining (at block 326) that the component startup criterion has been met. However, if the startup signal has not been received, the process continues to an action of determining (at block 328) that the component startup criterion has not been met.

As discussed above, the electrical component 115 may be an AC asynchronous motor 115 (e.g., an induction motor 115) comprising a rotor and a stator provided with a set of windings. During a startup process of an AC asynchronous motor 155, the rotor of the motor 115 is initially stationary (and subsequently only slowly rotating) while the magnetic field induced in a set of windings provided to the stator is rotating according to a frequency of an electrical voltage provided to the set of windings. As a result, initially no (and subsequently only a small) back electromotive force is induced within the set of windings as the motor 115 performs the startup process. Therefore, the electromotive force within the set of windings may be relatively large and the current drawn by the set of windings of the motor 115 may be correspondingly large. Consequently, the controller 190 may determine that the electrical component 115 is performing the startup process by detecting a transient load current.

To this end, the process of evaluating the component startup criterion may comprise an action of monitoring (at block 322) a current drawn from the DC link 121 by the load 180. The controller 190 may be provided with a current monitoring apparatus (not shown) for the purpose of monitoring the current drawn from the DC link 121 by the load 180. Suitable current monitoring apparatuses for this purpose will be apparent to those skilled in the art. Optionally, the process of evaluating the component startup criterion may also comprise an action of calculating (at block 324) a rate of change of the monitored current drawn from the DC link 121 by the load 180. The rate of change of the monitored current drawn may be calculated over a predetermined time-step.

The process of evaluating the component startup criterion then continues to an action of comparing (at block 323) the current drawn from the DC link 121 by the load 180 (as monitored in block 322) to a startup drawn current threshold, $I_{t1}$.

The startup drawn current threshold is selected as a value of the output current of the inverter 124 (e.g., by the motor 115) representing a transient load current drawn by the motor 115 and hence indicative that the load 180 is performing the startup process.

If it is found that the monitored current drawn from the DC link 121 by the load 180 exceeds the startup current drawn threshold, $I_{t1}$, as a result of the comparison (at block 323), the process continues to an action of determining (at block 326) that the component startup criterion has been met. On the other hand, if it is found that the monitored current drawn from the DC link 121 by the load 180 does not exceed the startup current drawn threshold, $I_{t1}$, as a result of the comparison (at block 323), the process may directly continue to an action of determining (at block 328) that the component startup criterion has not been met.

However, if the process of evaluating the component startup criterion comprises the action of calculating (at block 324) the rate of change of the monitored current drawn from the DC link 121 by the load 180, the process may instead continue to an action of comparing (at block 325) the rate of change of the current drawn from the DC link 121 by the load 180 (as monitored in block 324) to a startup drawn current rate of change threshold, $I_{t1}'$, after it is found that the monitored current drawn from the DC link 121 by the load 180 foes not exceed the startup current threshold.

The startup drawn current rate of change threshold is selected as a value of the calculated rate of change of the monitored current drawn from the DC link 121 by the load 180 (e.g., by the motor 115) which is indicative of a transient load current drawn by the motor 115 from the DC link 121 and hence the load 180 is beginning to perform the startup process. If it is found that the calculated rate of change of the monitored current drawn from the DC link 121 by the load 180 exceeds startup drawn current rate of change threshold, $I_{t1}'$, as a result of the comparison (at block 325), the process continues to an action of determining (at block 326) that the component startup criterion has been met. On the other hand, if it is found that the calculated rate of change of the monitored current drawn from the DC link 121 by the load 180 does not exceed the startup drawn current rate of change threshold, $I_{t1}'$, as a result of the comparison (at block 325), the process continues to an action of determining (at block 328) that the component startup criterion has not been met.

Figure 6:
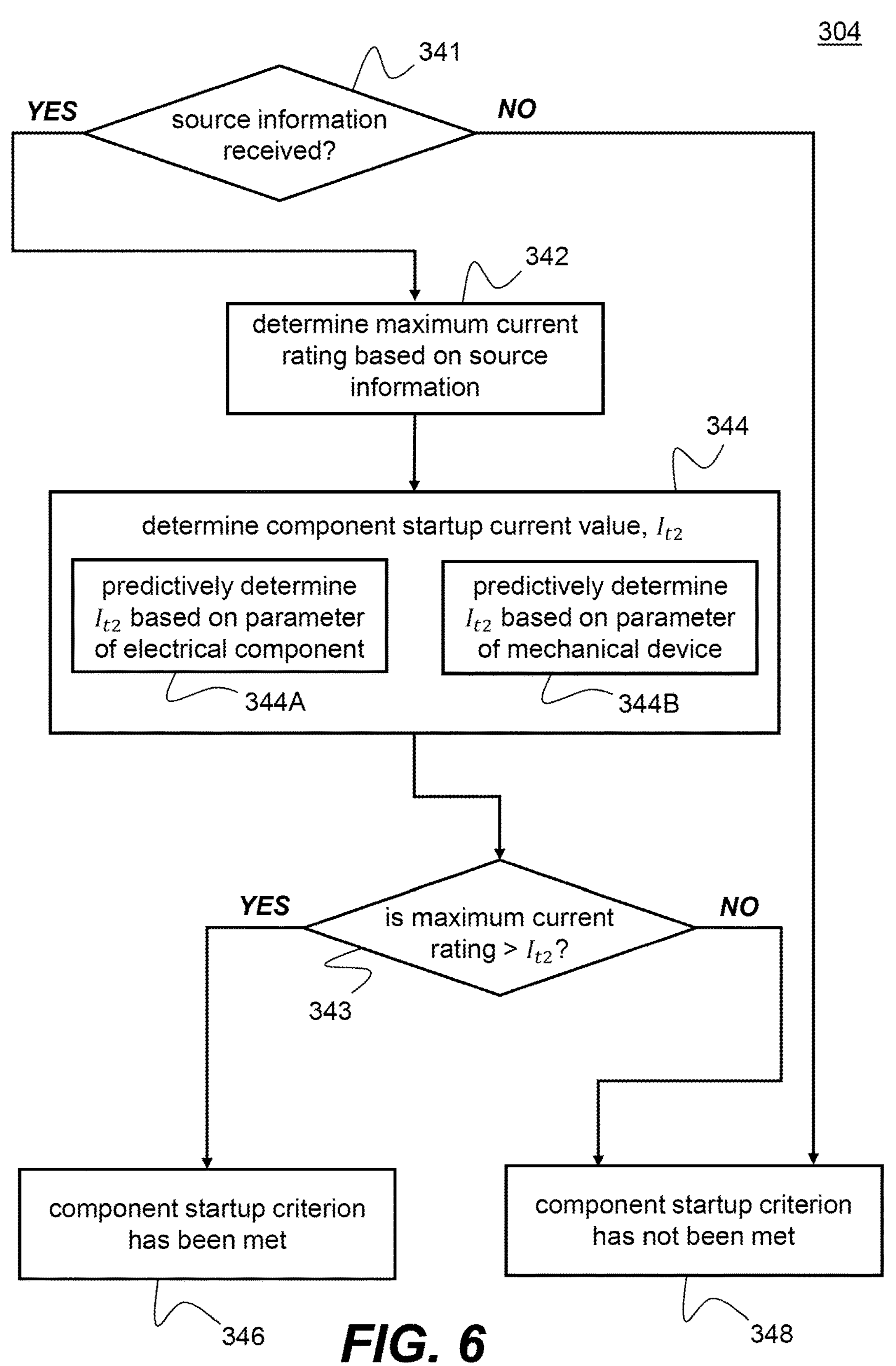
FIG. 6 is a flowchart which shows an example implementation of a process of evaluating a component startup criterion, as part of the method shown in FIG. 4.

FIG. 6 is a flowchart which shows an example implementation of the process of evaluating the source capability criterion, as represented by block 304 in FIG. 4. The source capability criterion relates to a capability of the external power source 175 to supply power to the DC link 121 via the power converter 122.

The controller 190 may be configured to receive source information relating to the external power source 175 and to determine whether the source capability criterion has been met based on the source information. Further, the controller may be configured to determine that the source capability criterion has not been met if no source information is received (that is, in the absence of source information). The controller 190 may be configured to receive the source information by means of any suitable wired or wireless data communication link. In an example, the controller 190 may be configured to receive the source information from a controller of the external power source 175 by means of a wired data communication link (e.g., which forms part of an external electrical cable external electrical cable which connects the external connection port 170 to the external power source 175) or a wireless data communication link (e.g., which is formed between respective transceivers of the controller 190 and the controller of the external power source 175). In another example, the controller 190 may be configured to receive the source information from a remote computing device (e.g., a remote server) via a public or a private network by means of a wired or wireless data communication link (e.g., an internet connection). The source information is indicative of (e.g., includes) a maximum current rating of the external power source 175.

The maximum current rating of the external power source 175 may be defined by at least one limiting factor. The maximum current rating of the external power source 175 is related to the power capability of the external power source 175. An example limiting factor is a safe current carrying limit of the external electrical cable which connects the external connection port 170 to the external power source 175. Another example limiting factor is a current delivery limit of an interface to the external power source 175 itself. If the external power source 175 is a local electrical grid, the current delivery limit may be determined by a fuse or circuit breaker in the interface to the external power source 175. Otherwise, if the external power source 175 is a mobile external electrical system (e.g., an electrical system of the tractor unit 14), the current delivery limit may be defined by an internal current limit of the mobile external electrical system. A further example limiting factor is a total loading on the external power source 175. For instance, it may be that the external power source 175 is a local electrical grid which is configured to supply electrical power (e.g., "shore power") to a plurality of electrical systems connected to the external power source 175 through respective interfaces. The plurality of electrical systems may require a given total current to be supplied thereto by the external power source 175 for proper operation. The total current supplied to the plurality of electrical systems may determine a maximum current (e.g., the maximum current rating) which the external power source 175 is able to supply to the apparatus 100 without affecting operation of the plurality of electrical systems which are already connected to the external power source 175. Otherwise, if the external power source 175 is a mobile external electrical system, the current delivery limit may be similarly defined by a total loading on the mobile external electrical system.

Accordingly, the process of evaluating the source capability criterion may comprise an action of determining (at block 341) whether the source information has been received. If the source information has been received, the process continues to an action of determining (at block 342) the maximum current rating of the external power source 175 based on the received source information. It may be that the source information is decoded and/or decrypted in order to determine the maximum current rating of the external power source 175. However, if the startup signal has not been received, the process instead continues directly to an action of determining (at block 348) that the component startup criterion has not been met.

After the maximum current rating of the external power source 175 has been determined (at block 342), the process of evaluating the source capability criterion continues to an action of determining a component startup current value, $I_{t2}$ (at block 344). The component startup current value, $I_{t2}$, is indicative of a maximum current drawn by the load 180 from the DC link 121 during the startup process of the electrical component 115.

In some examples, the action of determining the component startup current value, $I_{t2}$, includes predictively determining the component startup current value, $I_{t2}$. The component startup current value, $I_{t2}$, may be predictively determined based on a parameter (i.e., at least one parameter) of the electrical component 115 (e.g., the motor 115) and/or a parameter (i.e., at least one parameter) of the mechanical device (e.g., the compressor 402) which the electrical component 115 is configured to drive.

The at least one parameter of the electrical component 115 is directly associated with a magnitude of the transient load current (that is, the maximum current) which the electrical component 115 (and therefore the load 180) is predicted to draw during performance of the startup procedure. More specifically, the at least one parameter of the electrical component 115 (e.g., the motor 115) may be: a maximum transient current rating of the motor 115, a calendar age of the motor 115, a recorded running time of the motor 115, or a duration since a maintenance activity was performed on the motor 115. The maximum transient current rating of the motor 115 may correspond to a manufacturer's specification for an expected maximum current drawn by the motor 115 during performance of the startup process. The calendar age of the motor 115 may simply be a duration since the motor 115 was originally manufactured. The recorded running time of the motor 115 may be a total number of operational hours logged by the motor 115 since the motor 115 was originally manufactured or since a maintenance activity was performed on the motor 115. The maintenance activity of the motor 115 may be a service activity or an overhaul activity. Each of these parameters of the motor 115, in isolation or in combination, may be predictive of the transient load current drawn by the motor 115 during performance of the startup process.

The at least one parameter of the mechanical device is directly associated with a resistance of the mechanical device to being driven by the electrical component 115. Therefore, the at least one parameter of the mechanical device is indirectly associated with of the magnitude of the transient load current (that is, the maximum current) which the electrical component 115 (and therefore the load 180) is predicted to draw during performance of the startup procedure. More specifically, the at least one parameter of the mechanical device (e.g., the compressor 402) may be: a design rating of the compressor 402, a calendar age of the compressor 402, a recorded running time of the compressor 402, or a duration since a maintenance activity was performed on the compressor 402. The design rating of the compressor 402 may be generally indicative of a mechanical power rating of the compressor 402. In particular, the design rating of the compressor 402 may relate to a manufacturer's specification for a fluid pressure ratio across the compressor 402 during use and/or a fluid mass-flow rate through the compressor 402 during use. The calendar age of the compressor 402 may simply be a duration since the compressor 402 was originally manufactured. The recorded running time of the compressor 402 may be a total number of operational hours logged by the compressor 402 since the compressor 402 was originally manufactured or since a maintenance activity was performed on the compressor 402. The maintenance activity of the compressor 402 may be a service activity or an overhaul activity. Each of these parameters of the compressor 402, in isolation or in combination, may be indirectly predictive of the transient load current drawn by the motor 115 during performance of the startup process, especially when combined with the parameters of the electrical component 115 discussed above.

In the example of FIG. 6, the action of determining the component startup current value, $I_{t2}$, (at block 344) includes predictively determining the component startup current value based on both the parameter of the electrical component 115 (represented by block 344A) and also based on the parameter of the mechanical device (represented by block 344B). Nevertheless, it should be appreciated that in some examples, the component startup current value, $I_{t2}$, may be predictively determined based on only the parameter of the electrical component (represented by block 344A) and also based on the parameter of the mechanical device (represented by block 344B).

In other examples, the component startup current value, $I_{t2}$, may not be predictively determined. Instead, the component startup current value may be determined based on component information stored on a memory (e.g., a read-only memory) provided to the controller 190. The component information may be stored on the read-only memory during a manufacturing process of the apparatus 100. If so, the component startup current value, $I_{t2}$, may be referred to as a predefined component startup current value.

Following the action of determining the component startup current value, $I_{t2}$, the process of evaluating the source capability criterion then continues to an action of comparing (at block 343) the maximum current rating of the external power source 175 to the component startup current value, $I_{t2}$.

If it is found that the maximum current rating of the external power source 175 exceeds the component startup current value, $I_{t2}$, as a result of the comparison (at block 343), the process continues to an action of determining (at block 326) that the source capability criterion has been met. Conversely, if it is found that the maximum current rating of the external power source 175 does not exceed the component startup current value, $I_{t2}$, as a result of the comparison (at block 343), the process continues to an action of determining (at block 326) that the source capability criterion has not been met.

Figure 7:
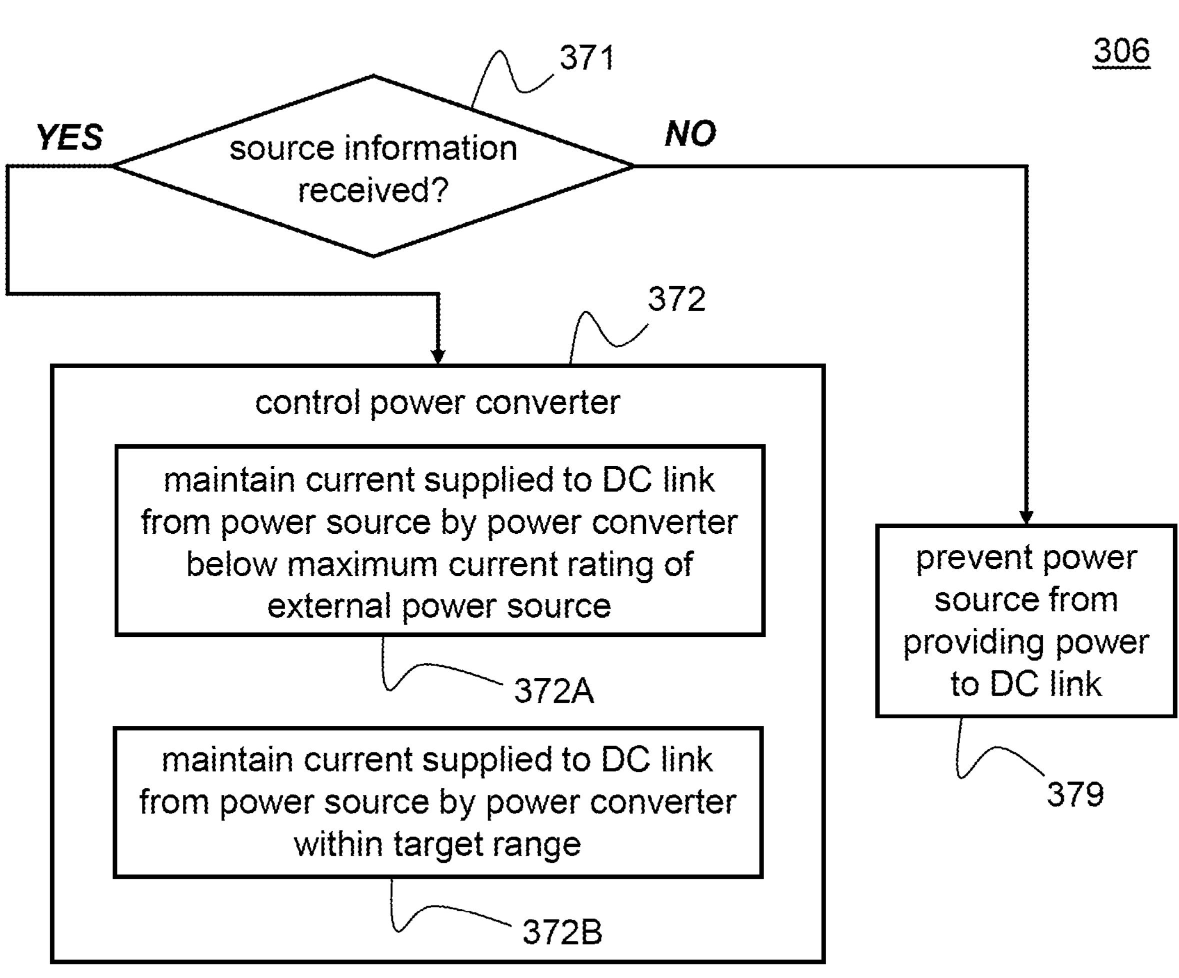
FIG. 7 is a flowchart which shows an example implementation of a process of operating the example apparatus of FIG. 3 in a protected startup mode, as part of the method shown in FIG. 4.

FIG. 7 is a flowchart which shows an example implementation of the process of operating the apparatus 100 in the protected startup mode, as represented by block 306 in FIG. 4.

The process of operating the apparatus in the protected startup mode may comprise an action of determining (at block 371) whether any source information has been received by the controller 190 in a similar manner to the action of determining whether the source information has been received described above with respect to FIG. 5 (at block 341). If source information has been received, the process continues to an action of controlling (at block 372) the power converter 122 to provide power from the external power source 175 to the DC link 121. However, if the source information has not been received, the process instead continues directly to an action of preventing (at block 379) the external power source 175 from providing power to the DC link 121 via the power converter 122.

The action of controlling (at block 372) the power converter 122 to provide power to the DC link 121 may include controlling (at block 372A) the power converter 122 to maintain a current supplied to the DC link 121 from the external power source 175 below the maximum current rating of the external power source 175, with the maximum current rating of the external power source 175 being as determined based on the source information during the process of evaluating the source capability criterion described above with reference to FIG. 5 (see block 342). Additionally or alternatively, the action of controlling (at block 372) the power converter 122 to provide power to the DC link 121 may include controlling (at block 372B) the power converter 122 to maintain a current supplied to the DC link 121 from the external power source 175 within a target range defined by an upper current limit and a lower current limit. Optionally, the upper current limit may correspond to (e.g., be equal to) the maximum current rating of the external power source 175. The lower current limit may correspond to a difference between the component startup current value, $I_{t2}$, and a maximum current rating of the battery 150, with the component startup current value, $I_{t2}$, being as determined during the process of evaluating the source capability criterion described above with reference to FIG. 5 (see block 344). The maximum current rating of the battery 150 may be selected as a current which corresponds to a maximum rate of discharge (e.g., C-rate) of the battery 150 to avoid excessive degradation of the battery 150. The maximum current rating of the battery 150 may be stored on a memory (e.g., a read-only memory) of or associated with the controller 190.

To achieve the above-mentioned objectives (discussed with respect to blocks 372A and 372B) during the action of controlling (at block 372) the power converter 122 to provide power to the DC link 121, the controller 190 may vary a control regime for at least one internal switching device of the power converter 122. For example, the controller 190 may vary a duty cycle and/or a switching frequency of the at least one internal switching device of the power converter 122, as will be appreciated by those skilled in the art. The controller 190 may also simultaneously vary a control regime for the DC-DC converter 128 to ensure that sufficient power is provided to the DC link 121 while the action of controlling (at block 372) the power converter 122 to provide power to the DC link 121 is carried out as described above.

Figure 8:
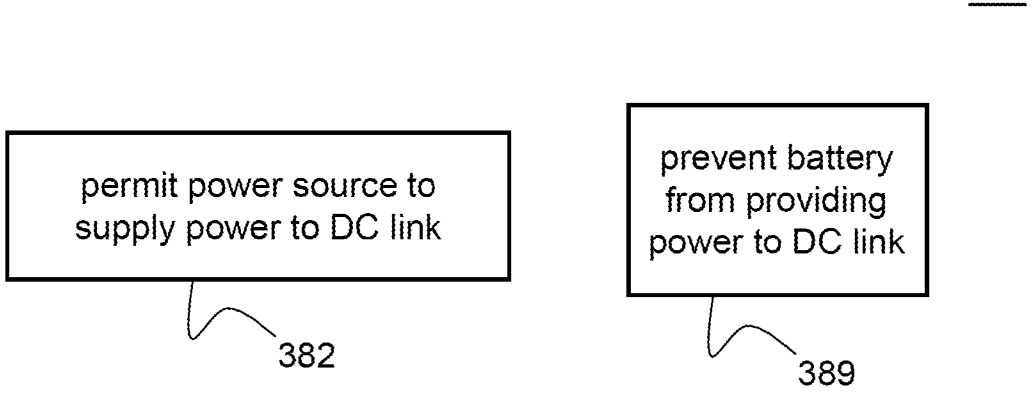
FIG. 8 is a flowchart which shows an example implementation of a process of operating the example apparatus of FIG. 3 in an unprotected startup mode, as part of the method shown in FIG. 4.

FIG. 8 is a flowchart which shows an example implementation of the process of operating the apparatus 100 in the unprotected startup mode, as represented by block 308 in FIG. 4. The process of operating the apparatus in the unprotected startup mode includes an action of permitting (at block 382) power to be provided to the DC link 121 from the external power source 175 as well as an action of preventing (at block 389) the battery 150 from providing power to the DC link 121. Consequently, when the apparatus 100 is operated in the unprotected startup mode, the battery 150 does not provide power to the DC link 121 and so energy stored within the battery 150 is not provided to the electrical component 115. The action of permitting (at block 382) power to be provided to the DC link 121 from the external power source 175 may include controlling the power converter 122 to cause the DC link 121 to be electrically decoupled from the external power source 175. In particular, the at least one internal switching device of the power converter 122 may be operated in an open state to electrically decouple the DC link 121 from the external power source 175. Conversely, the action of preventing (at block 389) the battery 150 from providing power to the DC link 121 may include, for example, operating the PDU 140 to isolate the DC link 121 from the battery 150 as described above with reference to FIG. 3.

Operation of the apparatus 100 in accordance with the methods disclosed herein ensures that the electrical component 115 may reliably complete a startup process despite any deficiencies in the power capability of the external power source 175 (e.g., across a range of operational scenarios) by selectively operating (at block 306) the apparatus 100 in the protected mode in which the battery 150 is discharged to supply power to the DC link 121 (and hence the electrical component 115). In addition, the actions of evaluating the source capability criterion and the component startup criterion as described herein provide that the apparatus 100 is only operated (at block 306) in the protected startup mode when it is accurately determined to be necessary. Otherwise, the apparatus 100 is operated (at block 308) in the unprotected startup mode, in which the battery 150 is not discharged to supply power to the DC link 121. It follows that operation of the apparatus 100 in accordance with the methods described herein may enable a cyclic degradation of the battery 150 to be reduced, thereby increasing the reliability and extending an operational lifetime of the apparatus 100.

It should be understood that the processes and actions described with respect to FIGS. 4-8 may be performed in any suitable order, and/or that the specific content of each step may be varied while still achieving the desired control outcomes described above.

The controller(s) described herein may comprise a processor. The controller and/or the processor may comprise any suitable circuitry to cause performance of the methods described herein and as illustrated in the drawings. The controller or processor may comprise: at least one application specific integrated circuit (ASIC); and/or at least one field programmable gate array (FPGA); and/or single or multi-processor architectures; and/or sequential (Von Neumann)/parallel architectures; and/or at least one programmable logic controllers (PLCs); and/or at least one microprocessor; and/or at least one microcontroller; and/or a central processing unit (CPU), to perform the methods and or stated functions for which the controller or processor is configured.

The controller or the processor may comprise or be in communication with one or more memories that store that data described herein, and/or that store machine readable instructions (e.g., software) for performing the processes and functions described herein (e.g., determinations of parameters and execution of control routines). The memory may be any suitable non-transitory computer readable storage medium, data storage device or devices, and may comprise a hard disk and/or solid state memory (such as flash memory). In some examples, the computer readable instructions may be transferred to the memory via a wireless signal or via a wired signal. The memory may be permanent non-removable memory or may be removable memory (such as a universal serial bus (USB) flash drive). The memory may store a computer program comprising computer readable instructions that, when read by a processor or controller, causes performance of the methods described herein, and/or as illustrated in the Figures. The computer program may be software or firmware or be a combination of software and firmware.

Except where mutually exclusive, a feature described in relation to any one of the above aspects may be applied mutatis mutandis to any other aspect. Furthermore, except where mutually exclusive, any feature described herein may be applied to any aspect and/or combined with any other feature described herein.

The invention claimed is:

1. An apparatus comprising controller circuitry, a load, a battery, and a DC link, wherein:
- the DC link is:
  - coupled to the load,
  - couplable to the battery, and
  - couplable to an external power source;
- the load comprises an electrical component; and
- the controller circuitry:
  - evaluating a component startup criterion relating to whether the electrical component is performing a startup process,
  - evaluating a source capability criterion relating to a capability of the external power source to supply power to the DC link, and
  - in response to a determination that the component startup criterion has been met and the source capability criterion has not been met, the controller circuitry causing the apparatus to operate in a protected startup mode in which the battery provides power to the DC link.

2. The apparatus of claim 1, wherein
- the controller circuitry:
  - in response to a determination that the component startup criterion and the source capability criterion have each been met, the controller circuitry causing the apparatus to operate in an unprotected startup mode in which the external power source provides power to the DC link and the battery does not provide power to the DC link.

3. The apparatus of claim 1, wherein
- the controller circuitry:
  - receiving source information relating to the external power source;
  - determining whether the source capability criterion has been met based on the source information; and
  - determining that the source capability criterion has not been met in the absence of source information.

4. The apparatus of claim 3, wherein
- the source information includes a maximum current rating of the external power source;
- the controller circuitry:
  - comparing the maximum current rating of the external power source to a component startup current value indicative of a maximum current drawn by the load from the DC link during the startup process of the electrical component,
  - determining that the source capability criterion has not been met when the component startup current value exceeds the maximum current rating of the external power source, and
  - determining that the source capability criterion has been met when the component startup current value does not exceed the maximum current rating of the external power source.

5. The apparatus of claim 4, wherein the component startup current value is predictively determined based on a parameter of the electrical component.

6. The apparatus of claim 5, wherein the electrical component is a motor; and
- wherein the parameter of the electrical component is selected from a group consisting of: a transient current rating of the motor, a calendar age of the motor, a recorded running time of the motor, and a duration since a maintenance activity was performed on the motor.

7. The apparatus of claim 4, wherein the electrical component is configured to drive a mechanical device, and wherein the component startup current value is predictively determined based on a parameter of the mechanical device.

8. The apparatus of claim 7, wherein the mechanical device is a compressor, and wherein the parameter of the mechanical device is selected from a group consisting of: a design rating of the compressor, a calendar age of the compressor, a recorded running time of the compressor, and a duration since a maintenance activity was performed on the compressor.

9. The apparatus of claim 4, further comprising a power converter, wherein the DC link is couplable to the external power source via the power converter, and wherein
- when operating the apparatus in the protected startup mode, the controller circuitry:

controlling the power converter to maintain a current supplied to the DC link from the external power source below the maximum current rating of the external power source.

10. The apparatus of claim 1, further comprising a power converter, wherein the DC link is couplable to the external power source via the power converter, and wherein when operating the apparatus in the protected startup mode, the controller circuitry:

controlling the power converter to maintain a current supplied to the DC link from the external power source within a target range.

11. The apparatus of claim 1, wherein when operating the apparatus in the protected startup mode, the controller circuitry:

preventing the external power source from providing power to the DC link.

12. The apparatus of claim 1, wherein the controller circuitry:

monitoring a current drawn from the DC link by the load;

comparing the monitored current drawn to a startup drawn current threshold;

determining that the monitored current drawn exceeds the startup drawn current threshold; and determining that the component startup criterion has been met if upon determining the monitored current drawn exceeds the startup drawn current threshold.

13. The apparatus of claim 1, wherein the controller circuitry:

monitoring a current drawn from the DC link by the load;

calculating a rate of change of the monitored current drawn;

comparing the calculated rate of change of the monitored current drawn to a startup drawn current rate of change threshold;

determining that the calculated rate of change of the monitored current drawn exceeds the startup drawn current rate of change threshold; and determining that the component startup criterion has been met upon determining the calculated rate of change of the monitored current drawn exceeds the startup drawn current rate of change threshold.

14. The apparatus of claim 1, wherein the controller circuitry:

receiving a startup signal; and determining whether the component startup criterion has been met based on the startup signal.

15. A transport refrigeration system comprising:

an apparatus comprising controller circuitry, a load, a battery, and a DC link, wherein:

the DC link is:

coupled to the load, couplable to the battery, and couplable to an external power source;

the load comprises an electrical component; and the controller circuitry:

evaluating a component startup criterion relating to whether the electrical component is performing a startup process, evaluating a source capability criterion relating to a capability of the external power source to supply power to the DC link, and in response to a determination that the component startup criterion has been met and the source capability criterion has not been met, causing the apparatus to operate in a protected startup mode in which the battery provides power to the DC link, wherein the electrical component is configured to drive a compressor of the transport refrigeration system.

16. A method of operating an apparatus comprising a controller, a load, a battery, and a DC link, wherein:

the DC link is:

coupled to the load, couplable to the battery, and couplable to an external power source; and the load comprises an electrical component;

the method comprising:

evaluating, by the controller, a component startup criterion relating to whether the electrical component is performing a startup process, evaluating, by the controller, a source capability criterion relating to a capability of the external power source to supply power to the DC link, and in response to a determination that the component startup criterion has been met and the source capability criterion has not been met, causing, by the controller, the apparatus to operate in a protected startup mode in which the battery provides power to the DC link.

17. A method of operating an apparatus comprising a controller, a load, a battery, a DC link, and a power converter, wherein:

the DC link is:

coupled to the load, couplable to the battery, and couplable to an external power source via the power converter; and the load comprises an electrical component;

the method comprising:

evaluating, by the controller, a component startup criterion relating to whether the electrical component is performing a startup process, evaluating, by the controller, a source capability criterion relating to a capability of the external power source to supply power to the DC link, and in response to a determination that the component startup criterion has been met and the source capability criterion has not been met, causing, by the controller, the apparatus to operate in a protected startup mode in which the battery provides power to the DC link;

the method further comprising, when operating the apparatus in the protected startup mode, controlling, by the controller, the power converter to maintain a current supplied to the DC link from the external power source within a target range.

* * * * *